(12) United States Patent
Huang et al.

(10) Patent No.: US 9,244,125 B2
(45) Date of Patent: Jan. 26, 2016

(54) DYNAMIC DESIGN PARTITIONING FOR SCAN CHAIN DIAGNOSIS

(71) Applicant: Mentor Graphics Corporation, Wilsonville, OR (US)

(72) Inventors: Yu Huang, Sudbury, MA (US); Huaxing Tang, Wilsonville, OR (US); Wu-Tung Cheng, Lake Oswego, OR (US); Robert Brady Benware, Clackamas, OR (US); Manish Sharma, Wilsonville, OR (US); Xiaoxin Fan, Austin, TX (US)

(73) Assignee: Mentor Graphics Corporation, Wilsonville, OR (US)

( * ) Notice: Subject to any disclaimer, the term of this patent is extended or adjusted under 35 U.S.C. 154(b) by 106 days.

(21) Appl. No.: 14/063,166

(22) Filed: Oct. 25, 2013

(65) Prior Publication Data

US 2014/0164859 A1 Jun. 12, 2014

Related U.S. Application Data

(60) Provisional application No. 61/718,683, filed on Oct. 25, 2012.

(51) Int. Cl.
*G01R 31/3177* (2006.01)
*G01R 31/3185* (2006.01)
*G01R 31/40* (2014.01)

(52) U.S. Cl.
CPC ...... *G01R 31/318536* (2013.01); *G01R 31/318541* (2013.01)

(58) Field of Classification Search
CPC .............. G01R 31/318536; G01R 31/31701; G01R 31/318541; G01R 31/318555; G01R 31/318572; G01R 31/318547; G01R 31/3187; G01R 31/318533; G11C 29/16
See application file for complete search history.

(56) References Cited

U.S. PATENT DOCUMENTS

| | | | | |
|---|---|---|---|---|
| 5,748,497 A * | 5/1998 | Scott | ............. | G01R 31/318378 702/123 |
| 2005/0081130 A1* | 4/2005 | Rinderknecht | | G01R 31/318547 714/726 |
| 2009/0089637 A1* | 4/2009 | Jun | ................ | G01R 31/318541 714/729 |
| 2013/0024830 A1 | 1/2013 | Tang et al. | | |
| 2013/0145213 A1 | 6/2013 | Tang et al. | | |

OTHER PUBLICATIONS

Xiaoxin, Fan, Huaxing, Tang, Yu, Huang, Wu-Tung Cheng, Sudhaker M. Reddy, and Brady Benware "Improved Volume Diagnosis Throughput Using Dynamic Design Partitioning" Test Conference (ITC), 2012 IEEE International Publication Year: 2012, pp. 1-10.

* cited by examiner

*Primary Examiner* — April Y Blair
*Assistant Examiner* — Dipakkumar Gandhi
(74) *Attorney, Agent, or Firm* — Klarquist Sparkman, LLP

(57) ABSTRACT

Aspects of the invention relate to techniques for chain fault diagnosis based on dynamic circuit design partitioning. Fan-out cones for scan cells of one or more faulty scan chains of a circuit design are determined and combined to derive a forward-tracing cone. Fan-in cones for scan cells of the one or more faulty scan chains and for failing observation points of the circuit design are determined and combined to derive a backward-tracing cone. By determining intersection of the forward-tracing cone and the backward-tracing cone, a chain diagnosis sub-circuit for the test failure file is generated. Using the process, a plurality of chain diagnosis sub-circuits may be generated for a plurality of test failure files. Scan chain fault diagnosis may then be performed on the plurality of chain diagnosis sub-circuits with a plurality of computers.

15 Claims, 9 Drawing Sheets

DYNAMIC DESIGN PARTITIONING FOR SCAN CHAIN DIAGNOSIS

RELATED APPLICATIONS

This application claims priority to U.S. Provisional Patent Application No. 61/718,683, filed on Oct. 25, 2012, and naming Huaxing Tang et al. as inventors, which application is incorporated entirely herein by reference.

FIELD OF THE INVENTION

The present invention relates to the field of integrated circuit (IC) testing technology. Various implementations of the invention may be particularly useful for scan chain fault diagnosis.

BACKGROUND OF THE INVENTION

Quick yield ramp-up is critical to IC manufacturing. During a yield ramp-up process, yield learning methods may be employed to identify systematic yield limiters. As the circuit feature size continuously shrinks and the design complexity continuously increases, traditional yield learning methods such as inline inspection, memory bitmapping and test chips are becoming less effective. Recently, statistical yield learning methods based on volume diagnosis have been developed. These methods statistically analyze diagnosis results for a large number of failing devices to extract systematic issues and/or dominant defect mechanisms.

For practical applications of these statistical yield learning methods, high quality volume diagnosis needs to be accomplished with a reasonable amount of computational resources and within a reasonable amount of time. With the size of modern circuit designs increasing continuously, however, the time for diagnosing a single failing device keeps increasing. Moreover, the larger the circuit design for a failing device, the greater amount of physical memory required. For a circuit design with hundreds of millions of gates, for example, a diagnosis tool may require up to hundreds of giga-bytes of memory.

A volume diagnosis process may be speeded up by using workstations equipped with a large number of processors and by improving the performance of diagnosis algorithms with various techniques such as pattern sampling, fault dictionary, and machine learning. The total amount of physical memory in a workstation, however, cannot be increased as fast as the number processors. As a result, a few diagnosis programs can easily use up all the memory of current workstations while most of the processors in the workstations have to stay idle. This severely limits the number of concurrently running diagnosis programs. The low efficiency of resource utilization, in addition to the increasing processor time for each failing integrated circuit device (or failing die), presents a serious challenge to diagnosis throughput and thus to practical applications of the yield learning methods based on volume diagnosis.

Fault diagnosis used in a volume diagnosis process usually includes two aspects: functional logic fault diagnosis and scan chain fault diagnosis (or scan chain diagnosis). The scan chain diagnosis is important because chain elements and their clock circuit and routing can easily occupy 30% of a chip's area and may account for up to 50% of chip failures. Having the ability to effectively diagnose failure scan chains is therefore crucial for yield learning.

In testing a device, two types of test patterns are typically applied: chain patterns and scan patterns. A chain pattern shifts a sequence through each of the scan chains, without exercising the functional circuitry. What is collected by the tester is what is shifted in or its complement, depending on how many inverters are along a chain. If a chain pattern fails on a scan chain, we know this chain is faulty. Chain patterns also help to model the fault (e.g. stuck-at fault or hold-time chain fault) of a faulty scan chain. However, to locate which scan cell has a defect, scan patterns have to be applied. A typical chain diagnosis flow is illustrated in FIG. 1.

As shown in the figure, chain patterns 110 are used to identify faulty scan chain(s) and to model scan chain fault(s). This straightforward analysis operation 130 does not require a lot of computational resources. On the other hand, the subsequent diagnosis operation 140 relies heavily on simulating scan patterns 120 against the entire circuit design, which can be the throughput bottleneck of the scan chain fault diagnosis. This is similar to challenges faced by the logic fault diagnosis. U.S. patent application Ser. No. 13/492,763 (filed on Jun. 8, 2012) and Ser. No. 13/680,447 (filed on Nov. 19, 2012), owned by the applicant, disclose some design partitioning techniques for improving throughput of volume logic diagnosis, which applications are incorporated herein by references. This disclosure focuses on improving throughput of volume chain diagnosis based on design partitioning.

BRIEF SUMMARY OF THE INVENTION

Aspects of the invention relate to techniques for chain fault diagnosis based on dynamic circuit design partitioning. According to various implementations of the invention, fan-out cones for scan cells of one or more faulty scan chains of a circuit design are determined and combined to derive a forward-tracing cone. The one or more faulty scan chains may be obtained by a chain pattern test. A fan-out cone of a scan cell may be determined by structurally tracing forward from the scan cell.

Also, fan-in cones for scan cells of the one or more faulty scan chains and for failing observation points of the circuit design are determined and combined to derive a backward-tracing cone. The failing observation points include scan cells of good scan chains and primary outputs that capture failing bits according to a test failure file. The test failure file may be obtained by a test with a set of scan patterns. A fin-in cone of a scan cell or a primary output may be obtained by structurally tracing backward from the scan cell or the primary output.

A chain diagnosis sub-circuit for the test failure file is generated by determining intersection of the forward-tracing cone and the backward-tracing cone.

In one aspect, scan chain fault diagnosis is performed on the chain diagnosis sub-circuit.

In a second aspect, a plurality of chain diagnosis sub-circuits are generated for a plurality of test failure files according to the above process. Scan chain fault diagnosis is performed on the plurality of chain diagnosis sub-circuits with a plurality of computers. The number of computers does not need to be the same as the number of chain diagnosis sub-circuits.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

DETAILED DESCRIPTION OF THE INVENTION

General Considerations

Various aspects of the present invention relate to using dynamic design partitioning for chain fault diagnosis. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate," "derive," and "combine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Scan Pattern Errors Caused by Faulty Chains and Circuit Partitioning

Figure 1:
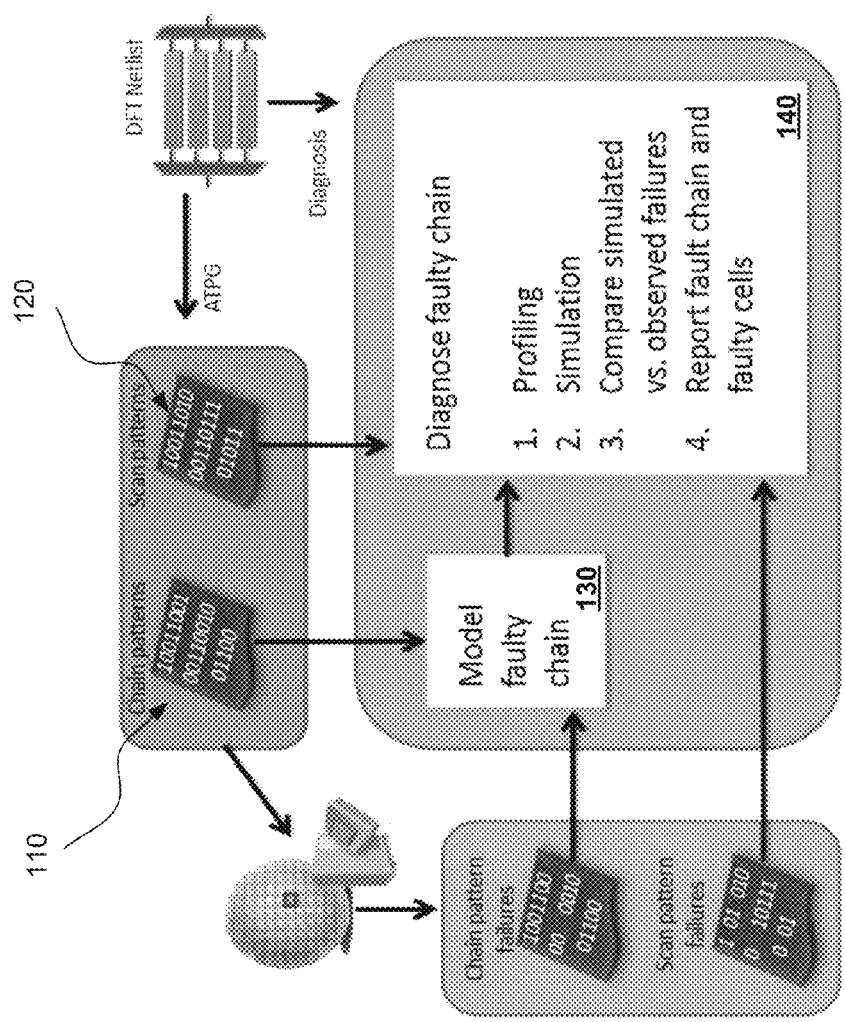
FIG. 1 illustrates an example of a chain diagnosis process (prior art).
Figure 2A:
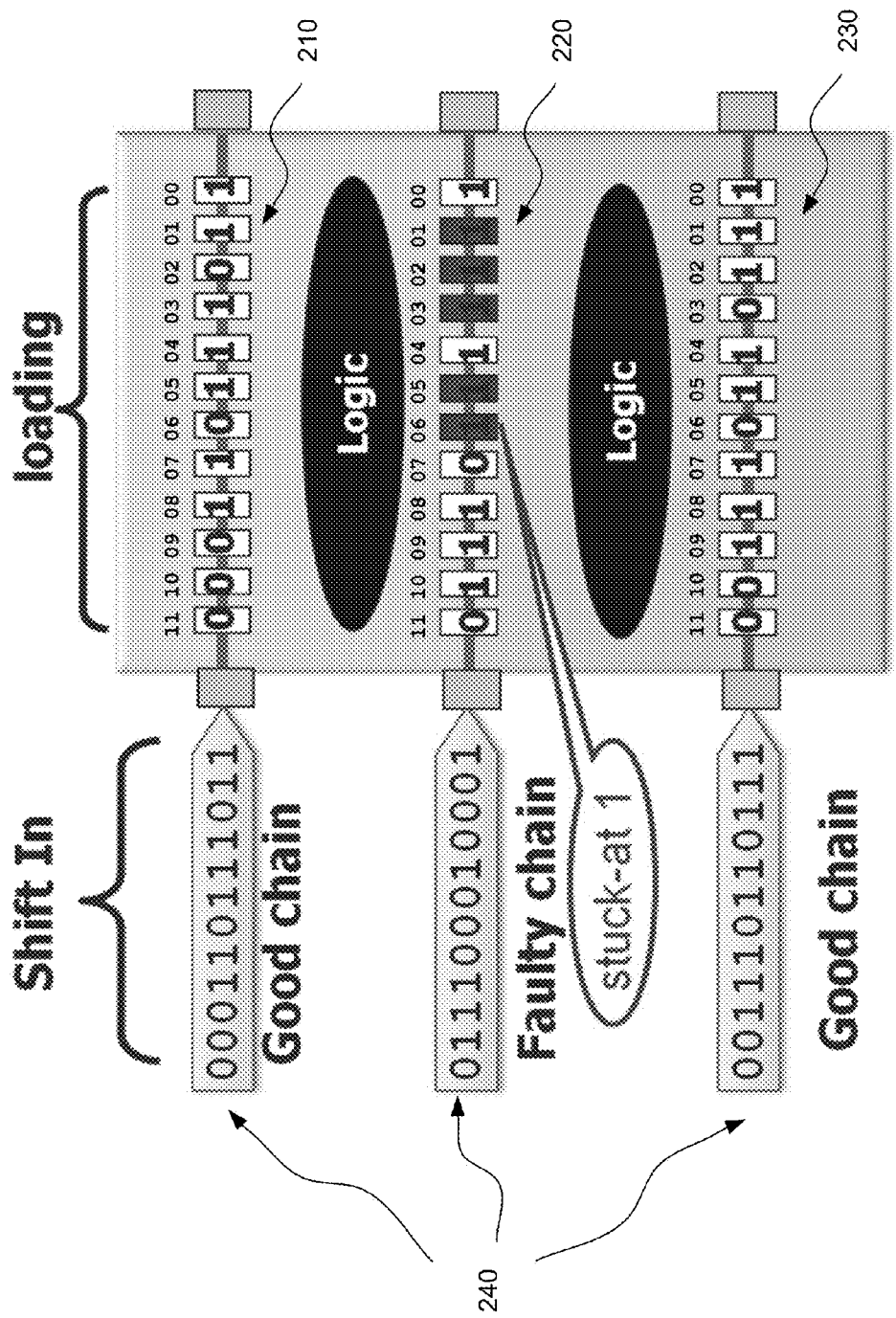
FIG. 2A illustrates an example of generating loading errors.
Figure 2B:
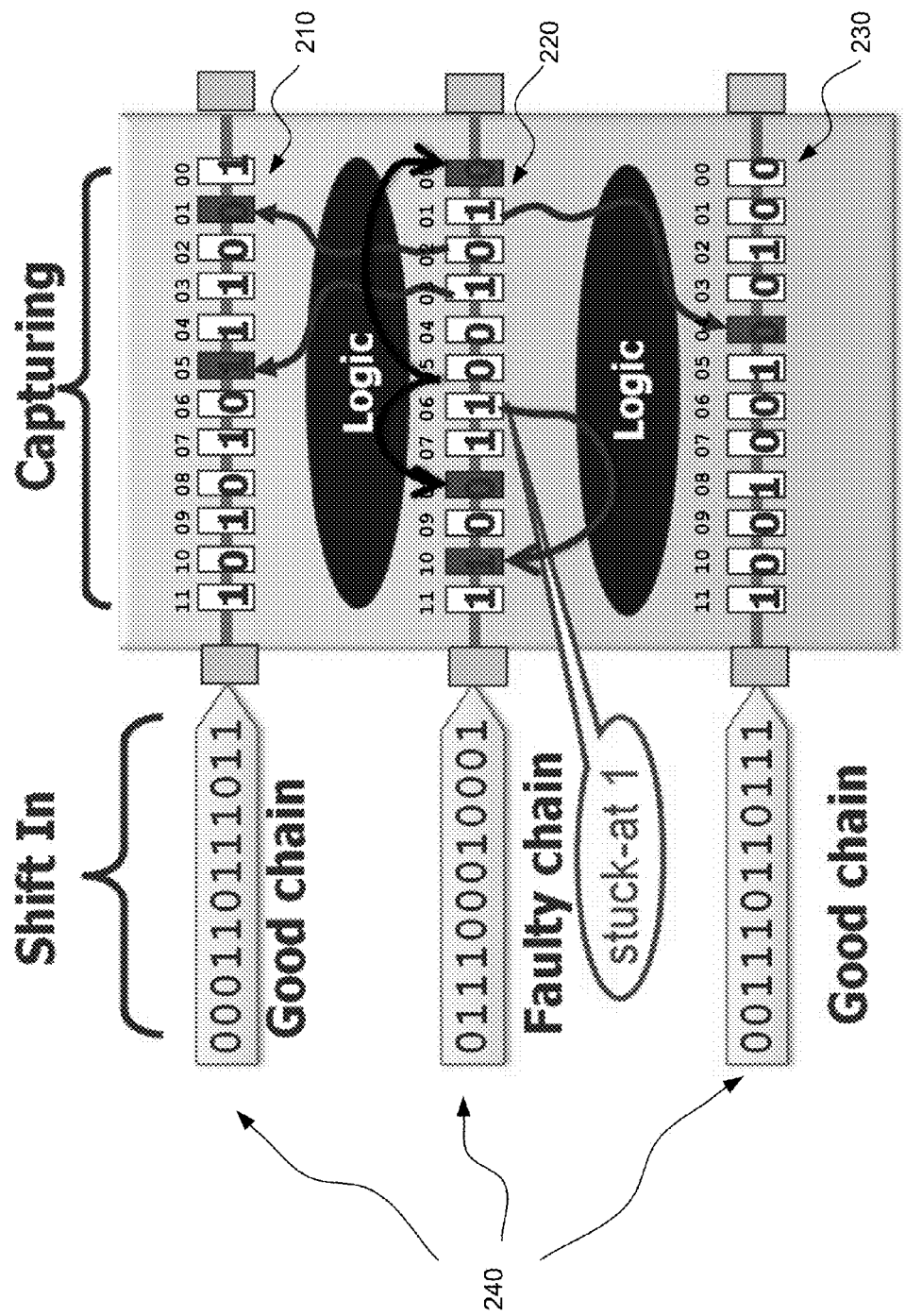
FIG. 2B illustrates an example of propagating loading errors to form captured errors.
Figure 2C:
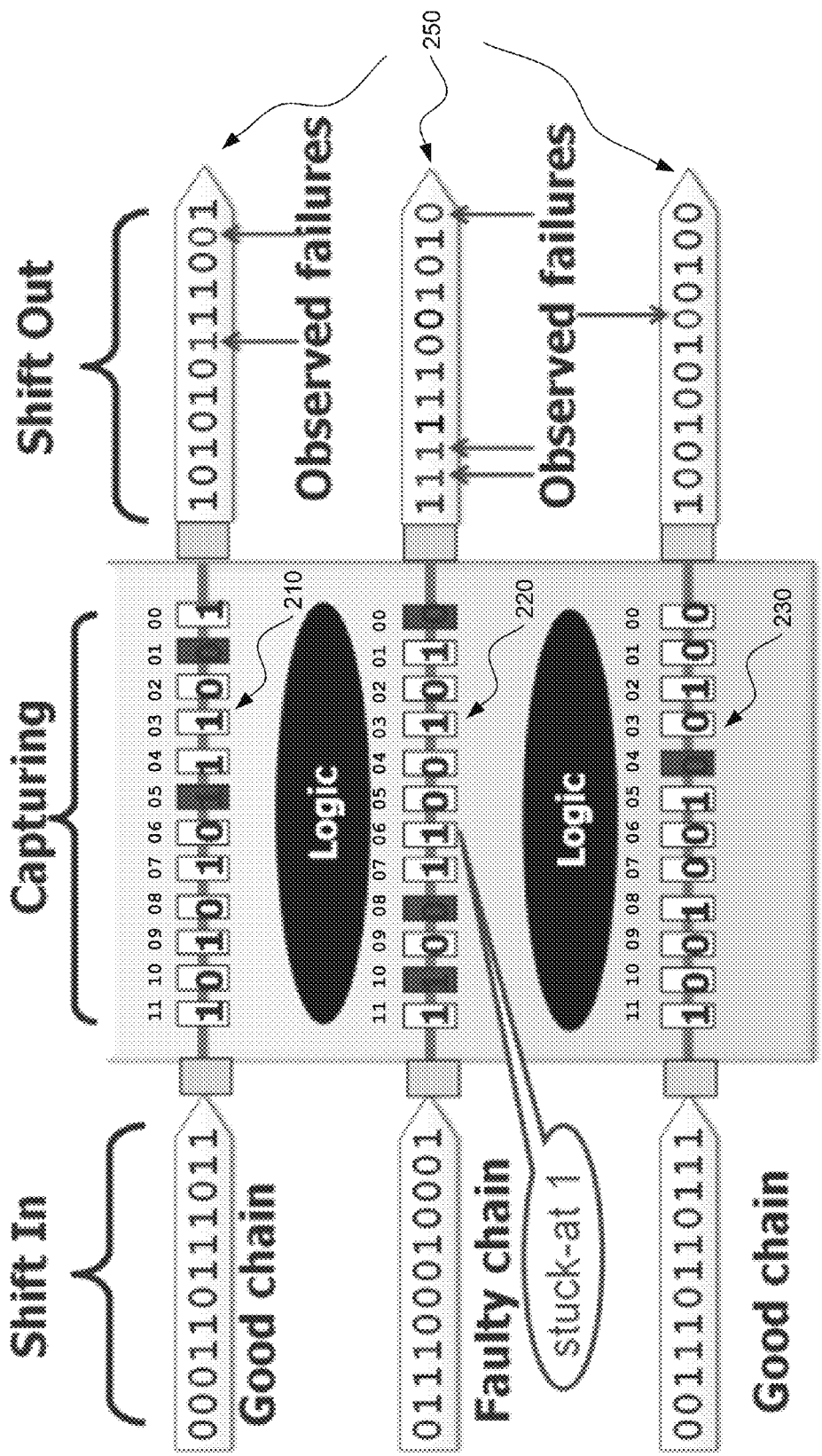
FIG. 2C illustrates an example of generating unloading errors.

A faulty scan chain can cause three types of errors when scan patterns are applied: loading errors, captured errors and unloading errors. FIGS. 2(A)-(C) illustrate these three types of errors, respectively. These figures use a circuit design having scan chains 210-230 as an example. Each of the scan chains has 12 scan cells. The scan cell connected to scan chain output is numbered 0 and the rest of the scan cells in each of the scan chains are numbered incrementally from scan output to scan input. The scan cell with index N is referred to as scan cell N. The middle chain 220 is a faulty chain, of which cell 6 has a defect modeled as a stuck-at-1 chain fault. The other two scan chains 210 and 230 are good chains—scan chains that have no defects. Loading errors happen only on a faulty scan chain, the chain 220 in this example. Given a scan pattern 240 in FIG. 2A, the loading errors for the faulty scan chain 220 happen at cell 1, 2, 3, 5, and 6.

After capturing clocks are pulsed for this scan pattern 240, the loading errors are propagated through the system logic to some cells on both of the good chains (210 and 230) and the faulty chain 220. These cells are said to have captured errors. As illustrated in FIG. 2B, the loading errors at cell 1, cell 2 and cell 3 of the faulty chain 220 are propagated to cell 4 of the good chain 230, cell 1 and cell 5 of the good chain 210, respectively; the loading errors at cell 5 and cell 8 of the faulty scan chain 220 are propagated to cell 0, cell 8, and cell 10 of the faulty scan chain 220 itself.

Due to unloading errors, some of the captured errors in the upstream of the defect location on the faulty chain may or may not be observed as failing bits. The observed output pattern 250 is illustrated in FIG. 2C. In this example, the error captured into cell 10 on the faulty chain 220 can be observed as a failing bit, but the error captured into cell 8 on the faulty chain 220 disappears due to the stuck-at-1 chain fault at cell 6 during the unloading process. On the other hand, the captured errors on good chains and in the downstream of the defect location on the faulty chain (cell 0 on the faulty chain in this example) should be observed at failing bits.

Based on the observed output pattern 250, the original scan pattern 240 and the circuit design, the defective scan cell 4 may be located by a chain diagnosis process. In the chain diagnosis process, failing bits of the good chains and primary output ports, caused by the loading errors, are usually back-traced through the system logic. As noted above, the loading errors may also propagate to some cells on the faulty chain (cells 0, 8 and 10 in FIG. 2B). The back-tracing should thus consider these cells. Because it is impossible to distinguish which bits are useful to identify the loading/unloading errors without knowing the location of the defective cell(s), all cells (bits) of the faulty scan chain need to be back-traced through the system logic. The back-tracing generates a back-tracing cone formed by the union of fan-in cones for failing bits of the good chains and primary output ports and those for all bits of the faulty scan chain(s).

Figure 3:
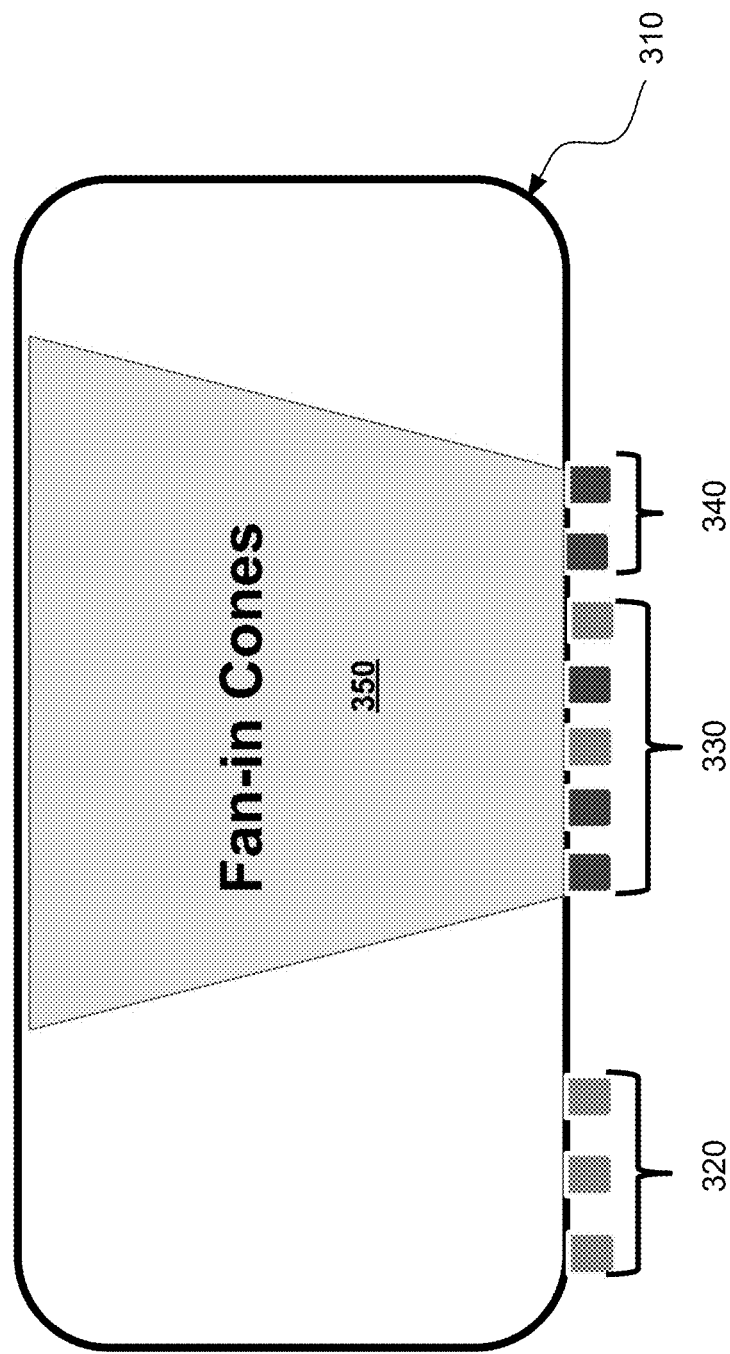
FIG. 3 illustrates an example of extracting a back-tracing cone.

FIG. 3 illustrates such an example. A back-tracing cone 350 is formed by combining fan-in cones of scan cells 330 of faulty scan chain(s) with those of failing bits 340 of good scan chains. Passing bits of the good scan chains are labeled as 320. Rather than simulating on the entire design 310, the back-tracing cone 350, a sub-circuit, may be employed to improve throughput of volume chain diagnosis.

Smaller than the full system design, the back-tracing cone may still be too large compared to partitions derived by dynamic partitioning techniques for functional logic diagnosis disclosed in the U.S. patent application Ser. No. 13/680, 447. This may be caused at least in part by the fact that fan-in cones of all bits of the faulty scan chain(s) are included. To further reduce the size of the sub-circuit used by chain diagnosis, a forward tracing cone may be derived to intersect the backward tracing cone. The obtained intersect may be employed for chain fault diagnosis.

Figure 4:
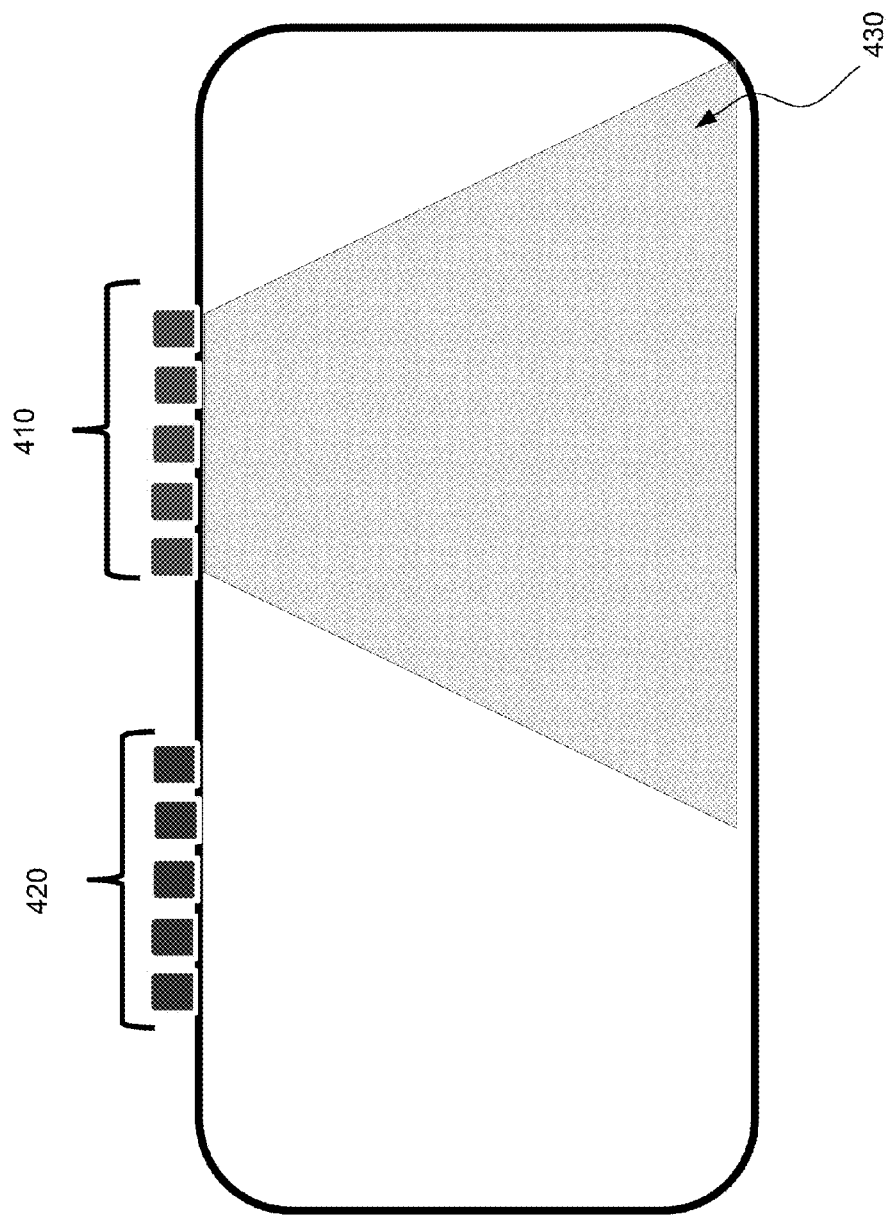
FIG. 4 illustrates an example of extracting a forward-tracing cone.

If a loading error can propagate to some observation points (scan cells and/or primary outputs), it will go through a fan-out logic cone of a scan cell on the faulty can chain. Therefore, the forward tracing cone may be derived by combining fan-out cones of all scan cells of the faulty scan chain(s). FIG. 4 illustrates an example of such a forward tracing cone 430. In the figure, scan cells 410 represent all bits of the faulty scan chain(s), while scan cells 420 represent bits of good scan chains.

Chain Fault Diagnosis Tools and Methods

Figure 5:
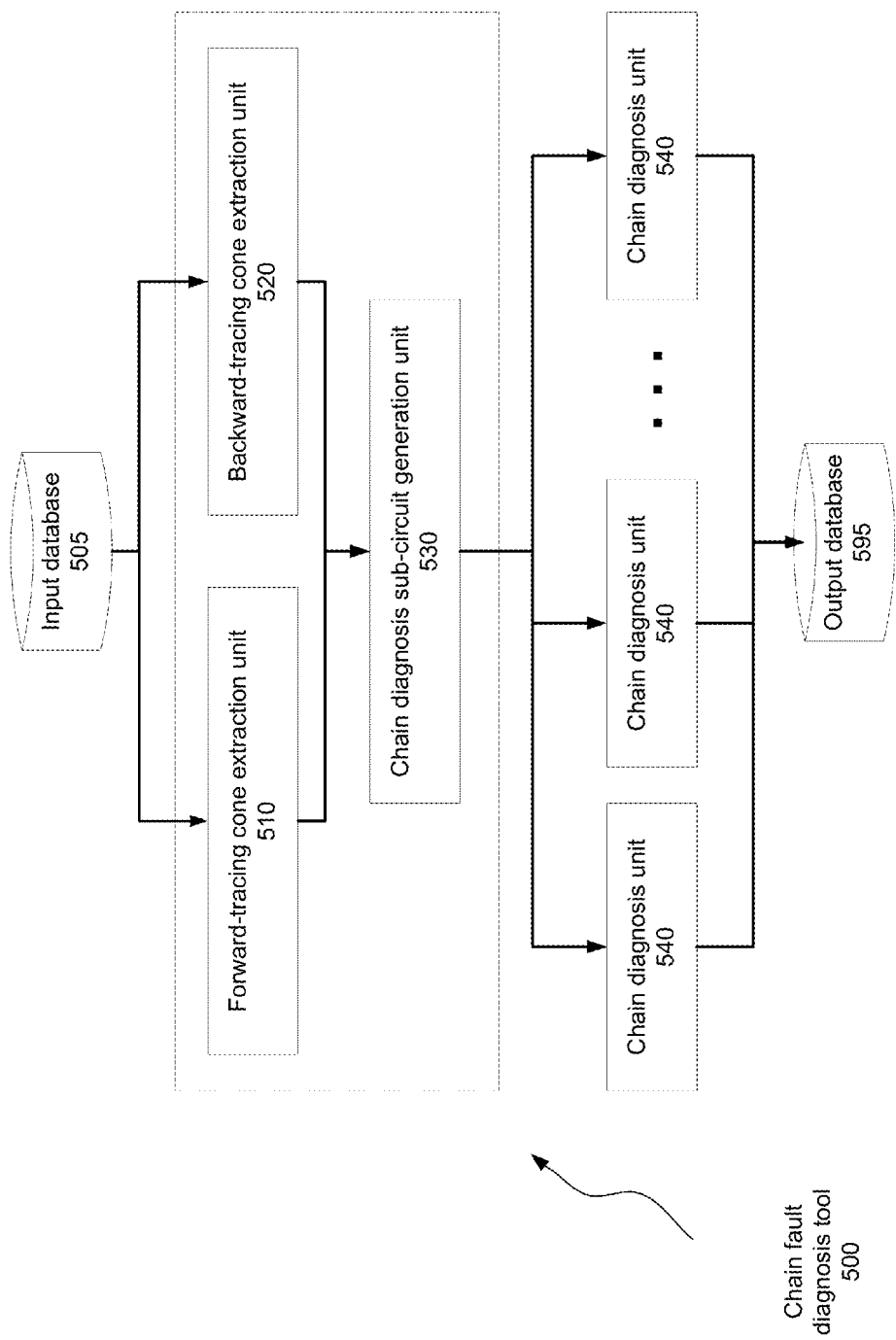
FIG. 5 illustrates an example of a chain fault diagnosis tool according to various embodiments of the invention.

FIG. 5 illustrates an example of a chain fault diagnosis tool according to various embodiments of the invention. As seen in the figure, the chain fault diagnosis tool 500 includes three units: a forward-tracing cone extraction unit 510, a backward-tracing cone extraction unit 520 and a chain diagnosis sub-circuit generation unit 530. As will be discussed in more detail below, some implementations of the chain fault diagnosis tool 500 may cooperate with (or incorporate) one or more of a chain diagnosis unit 540, an input database 505 and an output database 595. While the input database 505 and the output database 595 are shown as separate units in FIG. 5, a single data storage medium may be used to implement some or all of these databases.

Figure 7:
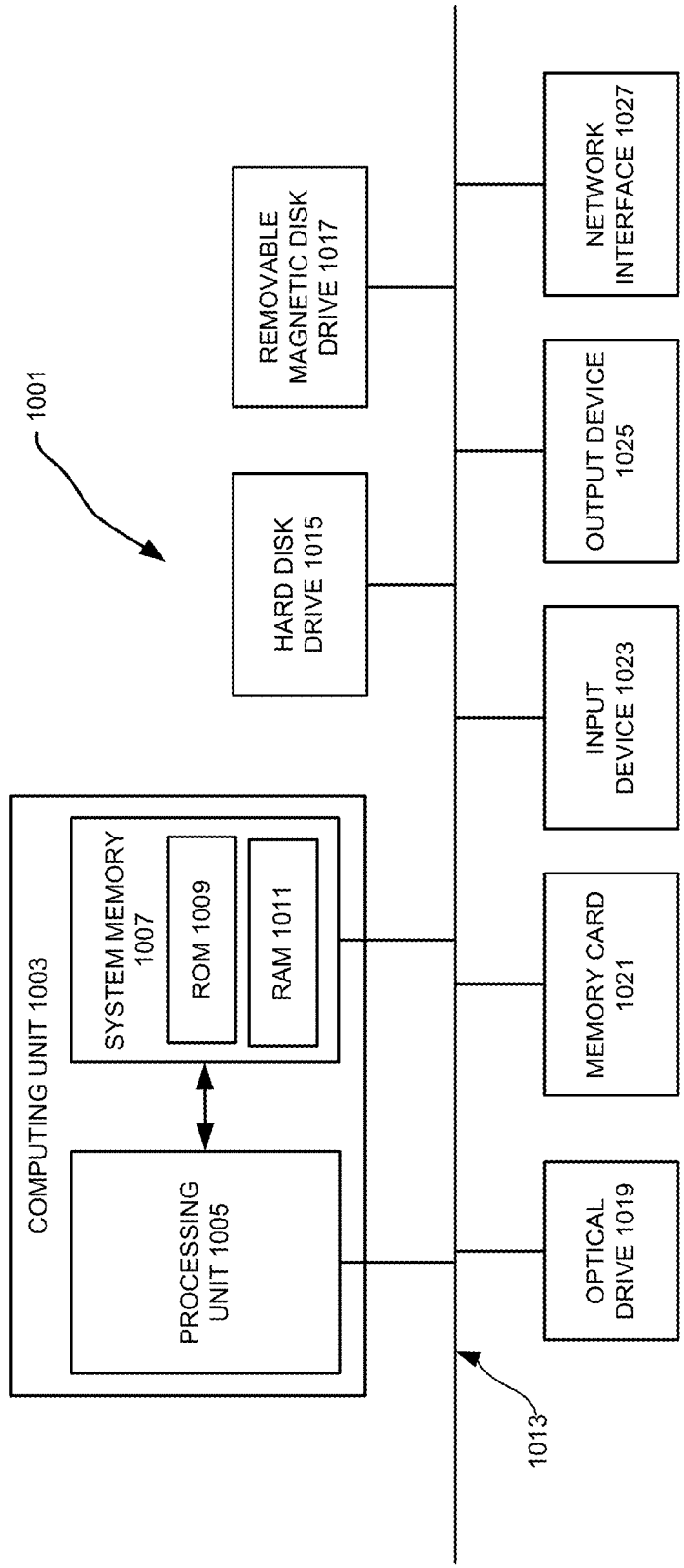
FIG. 7 illustrates a programmable computer system with which various embodiments of the invention may be employed.

According to various embodiments of the invention, one or more of the forward-tracing cone extraction unit 510, the backward-tracing cone extraction unit 520, the chain diagnosis sub-circuit generation unit 530, and the chain diagnosis unit 540 may be implemented by executing programming instructions on one or more programmable computers/computer systems, such as the computing system illustrated in FIG. 7. With some implementations of the invention, the forward-tracing cone extraction unit 510, the backward-tracing cone extraction unit 520, and the chain diagnosis sub-circuit generation unit 530 are implemented by executing programming instructions on a master computer while a plurality of the chain diagnosis units 540 are implemented by executing programming instructions on a plurality of servant computers. As such, only the master computer needs a large size of memory for full circuit analysis and the servant computers may run sub-circuit diagnosis concurrently for a large number of test failure files.

Correspondingly, some other embodiments of the invention may be implemented by software instructions, stored on a non-transitory computer-readable medium, for instructing one or more programmable computers/computer systems to perform the functions of one or more of the forward-tracing cone extraction unit 510, the backward-tracing cone extraction unit 520, the chain diagnosis sub-circuit generation unit 530, and the chain diagnosis unit 540. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

Figure 6:
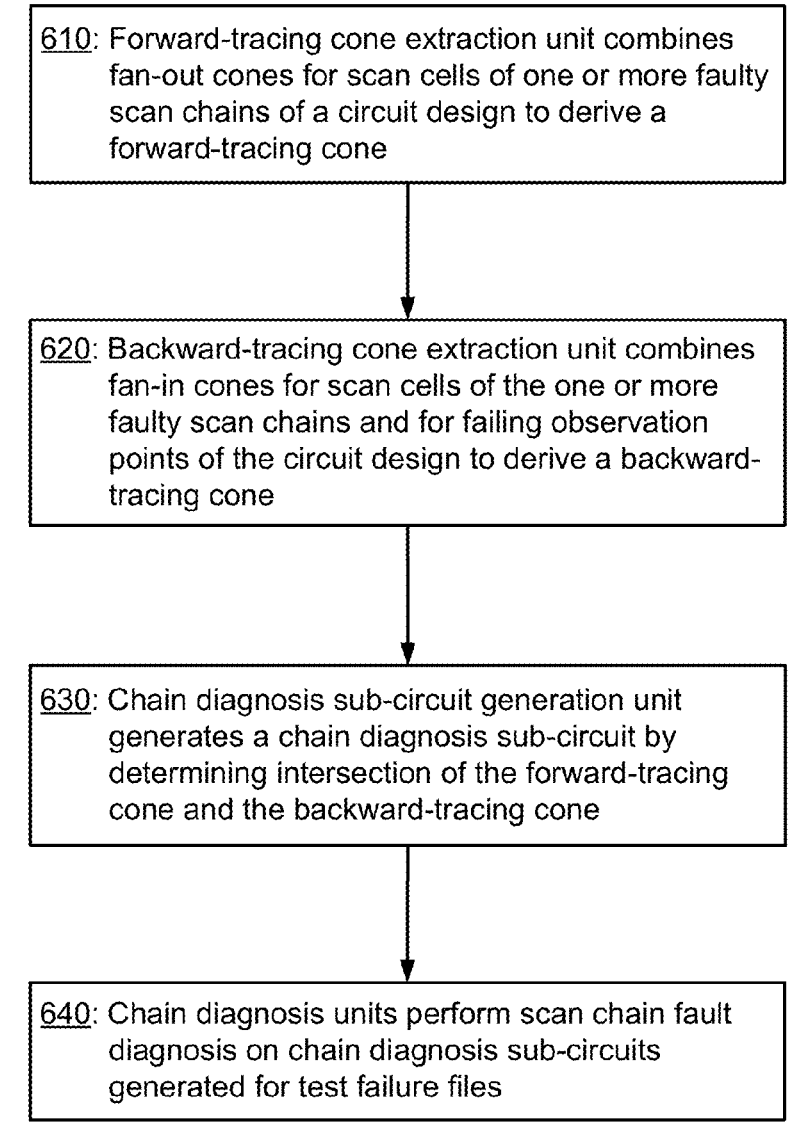
FIG. 6 illustrates a flowchart describing chain fault diagnosis methods that may be employed by various embodiments of the invention.

For ease of understanding, chain fault diagnosis methods that may be employed according to various embodiments of the invention will be described with reference to the chain fault diagnosis tool 500 illustrated in FIG. 5 and the flow chart 600 in FIG. 6. It should be appreciated, however, that alternate implementations of a chain fault diagnosis tool may be used to perform the chain fault diagnosis method shown in the flow chart 600 according to various embodiments of the invention. In addition, it should be appreciated that implementations of the chain fault diagnosis tool 500 may be employed with other chain fault diagnosis methods according to different embodiments of the invention.

Initially, in operation 610 of the flow chart 600, the forward-tracing cone extraction unit 510 combines fan-out cones for scan cells of one or more faulty scan chains of a circuit design to derive a forward-tracing cone. The circuit design may be in a netlist form. The one or more faulty scan chains may be obtained by applying chain pattern(s) to a die having the circuit design through a tester (a chain pattern test). A fan-out cone of a scan cell may be obtained by structurally tracing forward from the scan cell.

Next, in operation 620, the backward-tracing cone extraction unit 520 combines fan-in cones for scan cells of the one or more faulty scan chains and for failing observation points of the circuit design to derive a backward-tracing cone. The failing observation points include scan cells of good scan chains and primary outputs that capture failing bits according to a test failure file. The test failure file may be obtained by applying a set of scan patterns to the die having the circuit design through a tester. A fin-in cone of a scan cell or a primary output may be obtained by structurally tracing backward from the scan cell or the primary output.

It should be appreciated that while the flow chart 600 shows the operation 610 is performed before the operation 620, the operation 620 can be performed before or concurrently with the operation 610 according to various embodiments of the invention.

Next, in operation 630, the chain diagnosis sub-circuit generation unit 530 generates a chain diagnosis sub-circuit for the test failure file by determining intersection of the forward-tracing cone and the backward-tracing cone. On the boundary of intersection cone, although the gates will not be used in our diagnosis, their values may be constrained to some specific constant values of "0"s or "1"s, depending the system logic. This can ensure that the subsequent simulation during chain diagnosis gets correct results against only a subset of the original design.

Next, in operation 640, the chain diagnosis unit 540 performs scan chain fault diagnosis on the chain diagnosis sub-circuit. If there are a plurality of test failure files, e.g., obtained by applying the same set of scan patterns to a plurality of dies having the same circuit design, the operations 610-630 may be repeated for each of the test failure files to obtain a plurality of chain diagnosis sub-circuits. A plurality of chain diagnosis units 540 may perform scan chain faulty diagnosis on the plurality of test failure files in parallel.

It should be appreciated that the invention is applicable for circuit designs with on-chip test compression schemes. The observation point may be the output of the test compactor whose inputs are several internal observation points (scan cells). When back tracing a failing/passing observation point, all the internal observation points that feed into the observed compactor output may be traced.

Illustrative Operating Environment

As noted before, various embodiments of the invention may be implemented through the execution of software instructions by a computing device, such as a programmable computer. FIG. 7 shows an illustrative example of such a programmable computer (a computing device 1001). As seen in this figure, the computing device 1001 includes a computing unit 1003 with a processing unit 1005 and a system memory 1007. The processing unit 1005 may be any type of programmable electronic device for executing software instructions, but will conventionally be a microprocessor. The system memory 1007 may include both a read-only memory (ROM) 1009 and a random access memory (RAM) 1011. As will be appreciated by those of ordinary skill in the art, both the read-only memory (ROM) 1009 and the random access memory (RAM) 1011 may store software instructions for execution by the processing unit 1005.

The processing unit 1005 and the system memory 1007 are connected, either directly or indirectly, through a bus 1013 or alternate communication structure, to one or more peripheral devices. For example, the processing unit 1005 or the system memory 1007 may be directly or indirectly connected to one or more additional memory storage devices, such as a "hard" magnetic disk drive 1015, a removable magnetic disk drive 1017, an optical disk drive 1019, or a flash memory card 1021. The processing unit 1005 and the system memory 1007 also may be directly or indirectly connected to one or more input devices 1023 and one or more output devices 1025. The input devices 1023 may include, for example, a keyboard, a pointing device (such as a mouse, touchpad, stylus, trackball, or joystick), a scanner, a camera, and a microphone. The output devices 1025 may include, for example, a monitor display, a printer and speakers. With various examples of the computer 1001, one or more of the peripheral devices 1015-1025 may be internally housed with the computing unit 1003. Alternately, one or more of the peripheral devices 1015-1025 may be external to the housing for the computing unit 1003 and connected to the bus 1013 through, for example, a Universal Serial Bus (USB) connection.

With some implementations, the computing unit 1003 may be directly or indirectly connected to one or more network interfaces 1027 for communicating with other devices making up a network. The network interface 1027 translates data and control signals from the computing unit 1003 into network messages according to one or more communication protocols, such as the transmission control protocol (TCP) and the Internet protocol (IP). Also, the interface 1027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1001 is illustrated as an example only, and it not intended to be limiting. Various embodiments of the invention may be implemented using one or more computing devices that include the components of the computer 1001 illustrated in FIG. 7, which include only a subset of the components illustrated in FIG. 7, or which include an alternate combination of components, including components that are not shown in FIG. 7. For example, various embodiments of the invention may be implemented using a multi-processor computer, a plurality of single and/or multiprocessor computers arranged into a network, or some combination of both.

Some other embodiments of the invention may be implemented by software instructions, stored on a non-transitory computer-readable medium, for instructing one or more programmable computers/computer systems to perform operations such as those shown in the flow chart 400 in FIG. 4. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory processor-readable storage devices storing computer-executable instructions for causing one or more processors to perform a method, the method comprising:
    combining fan-out cones for scan cells of one or more faulty scan chains of a circuit design to derive a forward-tracing cone;
    combining fan-in cones for scan cells of the one or more faulty scan chains and for failing observation points of the circuit design to derive a backward-tracing cone, the failing observation points comprising scan cells of good scan chains and primary outputs that capture failing bits according to a test failure file; and
    generating a chain diagnosis sub-circuit for the test failure file by determining an intersection of the forward-tracing cone and the backward-tracing cone.

2. The one or more non-transitory processor-readable storage devices recited in claim 1, wherein the method further comprises: performing scan chain fault diagnosis on the chain diagnosis sub-circuit.

3. The one or more non-transitory processor-readable storage devices recited in claim 1, wherein the method further comprises: repeating the combining fan-out cones and the combining fan-in cones for another test failure file to derive another chain diagnosis sub-circuit for the another test failure file; and performing scan chain fault diagnosis on the chain diagnosis sub-circuit and the another chain diagnosis sub-circuit with a first computer and a second computer, respectively.

4. The one or more non-transitory processor-readable storage devices recited in claim 3, wherein the combining fan-out cones, combining fan-in cones, and generating are executed by a third computer.

5. The one or more non-transitory processor-readable storage devices recited in claim 1, wherein the one or more faulty scan chains are identified by a chain pattern test.

6. A method, executed by at least one processor of a computer, comprising:
    combining fan-out cones for scan cells of one or more faulty scan chains of a circuit design to derive a forward-tracing cone;

combining fan-in cones for scan cells of the one or more faulty scan chains and for failing observation points of the circuit design to derive a backward-tracing cone, the failing observation points comprising scan cells of good scan chains and primary outputs that capture failing bits according to a test failure file; and generating a chain diagnosis sub-circuit for the test failure file by determining an intersection of the forward-tracing cone and the backward-tracing cone.

7. The method recited in claim 6, further comprising:
performing scan chain fault diagnosis on the chain diagnosis sub-circuit.

8. The method recited in claim 6, further comprising:
repeating the combining fan-out cones and the combining fan-in cones for another test failure file to derive another chain diagnosis sub-circuit for the another test failure file; and performing scan chain fault diagnosis on the chain diagnosis sub-circuit and the another chain diagnosis sub-circuit with a first computer and a second computer, respectively.

9. The method recited in claim 8, wherein the combining fan-out cones, combining fan-in cones, and generating are executed by a third computer.

10. The method recited in claim 6, wherein the one or more faulty scan chains are identified by a chain pattern test.

11. A system comprising:
one or more processors, the one or more processors programmed to perform a method, the method comprising:
combining fan-out cones for scan cells of one or more faulty scan chains of a circuit design to derive a forward-tracing cone;

combining fan-in cones for scan cells of the one or more faulty scan chains and for failing observation points of the circuit design to derive a backward-tracing cone, the failing observation points comprising scan cells of good scan chains and primary outputs that capture failing bits according to a test failure file; and generating a chain diagnosis sub-circuit for the test failure file by determining an intersection of the forward-tracing cone and the backward-tracing cone.

12. The system recited in claim 11, wherein the method further comprises:
performing scan chain fault diagnosis on the chain diagnosis sub-circuit.

13. The system recited in claim 12, wherein the method further comprises:
repeating the combining fan-out cones and the combining fan-in cones for another test failure file to derive another chain diagnosis sub-circuit for the another test failure file; and performing scan chain fault diagnosis on the chain diagnosis sub-circuit and the another chain diagnosis sub-circuit with a first computer and a second computer, respectively.

14. The system recited in claim 13, wherein the combining fan-out cones, combining fan-in cones, and generating are executed by a third computer.

15. The system recited in claim 11, wherein the one or more faulty scan chains are identified by a chain pattern test.

* * * * *